United States Patent
Venkataraman et al.

(10) Patent No.: US 10,404,152 B2
(45) Date of Patent: Sep. 3, 2019

(54) VOLTAGE REGULATOR CIRCUITRY INCLUDING MODULE FOR SWITCHING FREQUENCY SELF-OPTIMIZATION

(71) Applicant: Intel Corporation, Santa Clara, CA (US)

(72) Inventors: Srikrishnan Venkataraman, Bangalore (IN); Sreedhar Narayanaswamy, Milpitas, CA (US); Jonathan P. Douglas, Olympia, WA (US); Chih-Chung Jonathan Wei, Santa Clara, CA (US); Ankush Varma, Hillsboro, OR (US); Narayanan Natarajan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 15/721,314

(22) Filed: Sep. 29, 2017

(65) Prior Publication Data

US 2019/0103801 A1 Apr. 4, 2019

(51) Int. Cl.
  *H02M 1/00* (2006.01)
  *G06F 1/26* (2006.01)
  *H03L 7/099* (2006.01)

(52) U.S. Cl.
  CPC ............... *H02M 1/00* (2013.01); *G06F 1/26* (2013.01); *H02M 2001/0009* (2013.01); *H03L 7/099* (2013.01)

(58) Field of Classification Search
  CPC ... H02M 1/00; H02M 2001/0009; G06F 1/26; H03L 7/099
  See application file for complete search history.

(56) References Cited

U.S. PATENT DOCUMENTS

| | | |
|---|---|---|
| 2004/0150928 A1 | 8/2004 | Goodfellow et al. |
| 2011/0115454 A1 | 5/2011 | Benedict et al. |
| 2012/0056605 A1 | 3/2012 | Ooba |
| 2012/0236610 A1* | 9/2012 | Lee ........................ H02M 3/285 363/65 |
| 2013/0342181 A1 | 12/2013 | Suppanz et al. |
| 2014/0006808 A1 | 1/2014 | Sizikov et al. |

OTHER PUBLICATIONS

"International Application Serial No. PCT/US2018/051485, International Search Report dated Jan. 11, 2019", 3 pgs.
"International Application Serial No. PCT/US2018/051485, Written Opinion dated Jan. 11, 2019", 5 pgs.

* cited by examiner

*Primary Examiner* — Carlos Amaya
(74) *Attorney, Agent, or Firm* — Schwegman Lundberg & Woessner, P.A.

(57) ABSTRACT

Some embodiments include apparatuses and methods of using such apparatuses. One of the apparatuses includes voltage regulators in an integrated circuit device, and a frequency control block and a module included in the integrated circuit device. Each of the voltage regulators includes a current sensor. The frequency control block operates to provide a clock signal to each of the voltage regulators. The clock signal has a frequency based on digital information. The module operates to receive a current from the current sensor of each of the voltage regulators and provides the digital information to the frequency control block to control the frequency of the clock signal. The digital information has a value based on the current from each of the current sensors.

20 Claims, 6 Drawing Sheets

VOLTAGE REGULATOR CIRCUITRY INCLUDING MODULE FOR SWITCHING FREQUENCY SELF-OPTIMIZATION

TECHNICAL FIELD

Embodiments described herein pertain to voltage regulators, some embodiments relate to fully-integrated voltage regulators in integrated circuit devices and systems.

BACKGROUND

A fully-integrated voltage regulator (FIVR) is a voltage regulator (e.g., voltage converter) included in the same integrated circuit (IC) device with other components (e.g., processing circuitry, memory circuitry, and other circuitries) of the IC device. An FIVR often includes a pulse-width modulation (PWM) control loop running at switching frequency in the megahertz range. The control loop operates to control the value of an output voltage provided (e.g., regulated) by the voltage regulator. In many conventional techniques, this switching frequency is set to be a fixed value across IC devices of the same design (e.g., IC devices from the same manufacturer and have the same structure to perform the same functions) Further, such switching frequency is also set at the same value across different operating states (e.g., power states) within the same IC device. As is known to those skilled in the art, IC devices of the same design may have analog domain differences, and may have different optimal operating points for the same operating state. Thus, conventional techniques of setting the switching frequency for the FIVRs in such IC devices may be sub-optimal and may cause the performance of the FIVRs in the IC device to be inefficient.

DETAILED DESCRIPTION

The techniques described herein include an IC device that has a module to optimize the switching frequency of FIVRs in the IC device. In some examples, the described techniques include an auto-trim module (e.g., a frequency tuning circuitry in the IC device) that can use information from current sensors in the FIVRs of the IC device to generate and adjust (e.g., automatically adjust) digital information (e.g., digital code). The digital information is provided to a VCO of the IC device. The VCO generates a clock signal (e.g., a master clock signal) that has a frequency based on the value of the digital information. The clock signal is provided to the FIVRs. A clock generator (e.g., phase-locked loop (PLL)) in each of the FIVRs uses the clock signal generated by the VCO to subsequently generate multi-phase clock signals for use in operation of the FIVR. Based on information from current sensors of the FIVRs, the auto-trimmodule can adjust the value of the digital information to find an optimal value (e.g., best value) for the frequency of the clock signal, which is also the switching frequency of the FIVRs. The techniques described herein can be performed on the IC device after the IC device is manufactured (e.g., in post-silicon phase) on a per device basis and per power state (PS) basis.

The techniques described herein can be performed in static mode and dynamic mode. In the static mode, the digital information (that provides the optimal switching frequency for the FIVRs) can be stored (e.g., in the form of configuring memory elements (e.g., fuses)) in the IC device. Then, the VCO of the IC device can use the stored digital information to generate the clock signal in normal operations of the IC device. In the dynamic mode, the digital information generated by the auto-trim module can be used directly during real-time operations (e.g., during normal operations) of the IC device. Some of the improvements and benefits of the described techniques include a reduction in the total power loss in the IC device.

Figure 1:
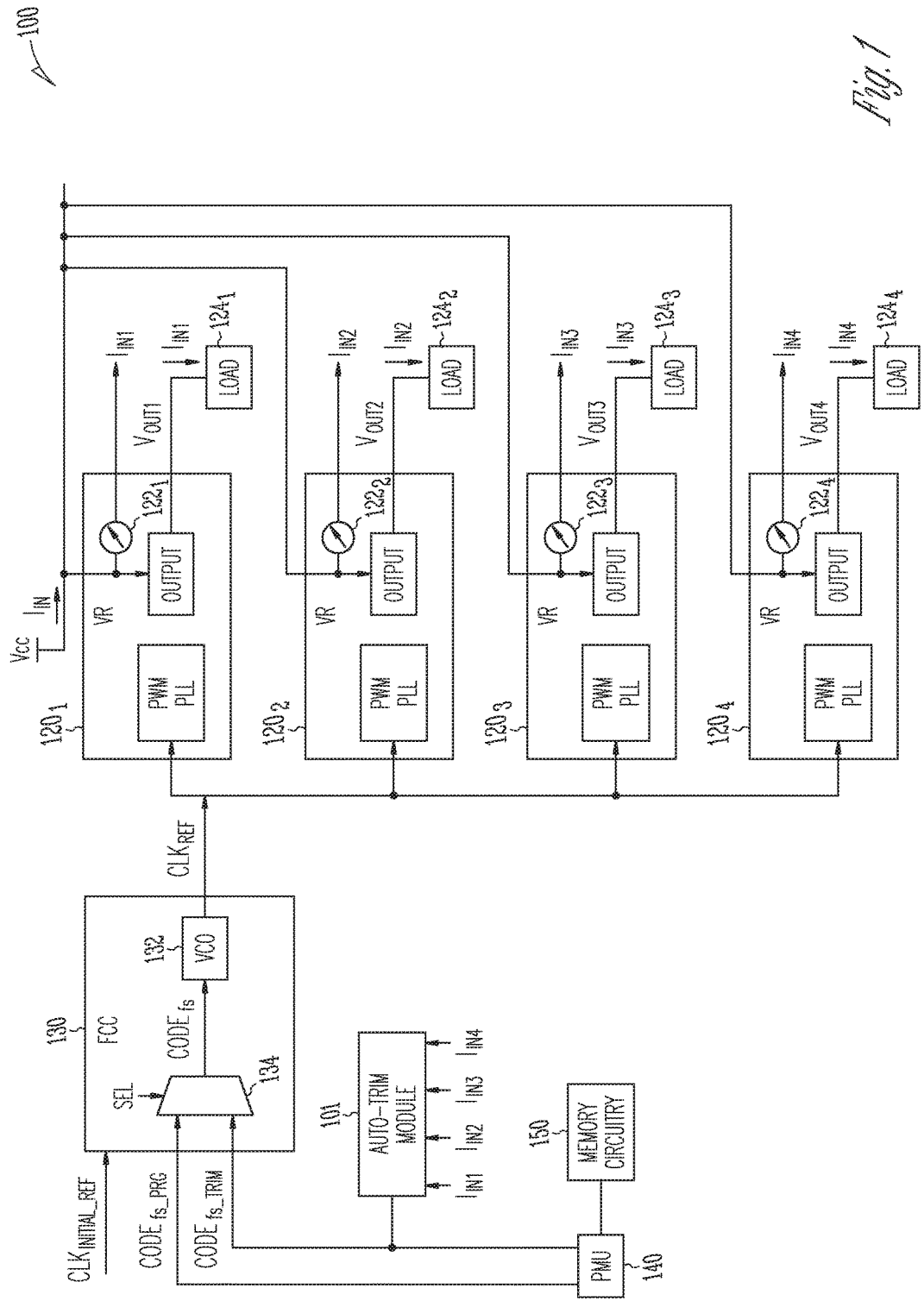
FIG. 1 shows an apparatus in the form of an IC device including voltage regulators and an auto-trim module, according to some embodiments described herein.

FIG. 1 shows an apparatus in the form of an IC device 100 including voltage regulators (VRs) $120_1$, $120_2$, $120_3$, and 1204 and an auto-trim module 101, according to some embodiments described herein. IC device 100 can include or can be included in a system-on-chip (SoC). Voltage regulators $120_1$, $120_2$, $120_3$, and $120_4$ can be located in (e.g., formed in or formed) on the same chip (e.g., same die) with other components (e.g., loads $124_1$, $124_2$, $124_3$, and $124_4$) of IC device 100. FIG. 1 shows IC device 100 includes four voltage regulators $120_1$, $120_2$, $120_3$, and $120_4$ (e.g., four FIVRs) as an example. However, the number of voltage regulators of IC device 100 can vary.

Each of voltage regulators $120_1$, $120_2$, $120_3$, and $120_4$ can operate at a switching frequency based on the frequency of a clock signal (e.g., global reference clock signal) $CLK_{REF}$. Each of voltage regulators $120_1$, $120_2$, $120_3$, and $120_4$ can include a phase-locked loop (labeled as "PLL" in FIG. 1) that can be part of a clock generator of the respective voltage regulator. Each PLL can operate to lock to clock signal $CLK_{REF}$ and provide multiple clock phases (not shown) to the PWM controller (e.g., PWM loop) of the respective voltage regulator. Each of voltage regulators $120_1$, $120_2$, $120_3$, and $120_4$ can use the multiple clock phases generated by its PLL as timing signals for operations in a respective voltage regulator.

Each of voltage regulators $120_1$, $120_2$, $120_3$, and $120_4$ can receive a voltage $V_{IN}$, which can include a supply voltage (e.g., $V_{CC}$) of IC device 100. Each of voltage regulators $120_1$, $120_2$, $120_3$, and $120_4$ can include an output stage (labeled as "OUTPUT" in FIG. 1) to provide a voltage (e.g., output voltage) $V_{OUT1}$, $V_{OUT2}$, $V_{OUT3}$, or $V_{OUT4}$ based on voltage $V_{IN}$. Voltage regulators $120_1$, $120_2$, $120_3$, and $120_4$ can be buck voltage regulators. For example, the output stage of each of voltage regulators $120_1$, $120_2$, $120_3$, and $120_4$ can include a voltage converter (e.g., DC-DC buck converter) such that the value of each of voltages $V_{OUT1}$, $V_{OUT2}$, $V_{OUT3}$, and $V_{OUT4}$ is less than the value of voltage $V_{IN}$. Voltages $V_{OUT1}$, $V_{OUT2}$, $V_{OUT3}$, and $V_{OUT4}$ can have different values.

Loads $124_1$, $124_2$, $124_3$, and $124_4$ can use voltages $V_{OUT1}$, $V_{OUT2}$, $V_{OUT3}$, and $V_{OUT4}$ as input voltages (e.g., load supply voltages), respectively. Each of loads $124_1$, $124_2$, $124_3$, and $124_4$ can include a functional unit to perform a function (e.g., signal processing functions, memory storage functions, and other functions of an IC device). IC device 100 can have different power states associated with different operations of IC device 100. During an operation of IC device 100 (e.g., during a particular power state), loads $124_1$, $124_2$, $124_3$, and $124_4$ can consume currents (e.g., load input currents) $I_{IN1}$, $I_{IN3}$, and $I_{IN4}$, respectively. In FIG. 1, current (e.g., supply input current) $I_{IN}$ can be the sum of currents $I_{IN1}$, $I_{IN2}$, $I_{IN3}$, and $I_{IN4}$. Thus, the value of the current $I_{IN}$ can be the total of the values of currents $I_{IN1}$, $I_{IN2}$, $I_{IN3}$, and $I_{IN4}$.

Each of voltage regulators $120_1$, $120_2$, $120_2$ and $120_4$ can also include a current sensor $122_1$, $122_2$, $122_3$, and $122_4$ that can operate to calculate (e.g., measure) the value of a respective current $I_{IN1}$, $I_{IN2}$, $I_{IN3}$, or $I_{IN4}$. As described in more detail below, IC device 100 can use current information (e.g., current values) provided by currents $I_{IN1}$, $I_{IN2}$, $I_{IN3}$, and $I_{IN4}$ (voltage regulator power domain input currents) to optimize value of the frequency of clock signal $CLK_{REF}$ in order to improve (e.g., reduce) power consumption of IC device 100.

As shown in FIG. 1, IC device 100 can include a master frequency control block (FCC) 130 that can operate to generate and control the frequency of clock signal CLK_REF. FTC 130 can include a free-running VCO 132, which can serve as the source of clock signal CLK_REF. FIG. 1 shows a VCO 132 being used to generate clock signal CLK_REF as an example. However, a digital-controlled oscillator (DCO) can be used.

Clock signal $CLK_{REF}$ has a frequency fs, which can be the switching frequency of each of voltage regulators $120_1$, $120_2$, $120_3$, and $120_4$. The frequency fs of clock signal CLK_REF can have a first-order impact on the power efficiency achieved by voltage regulators $120_1$, $120_2$, $120_3$, and $120_4$. Thus, by adjusting the frequency fs of clock signal CLK_REF, the power efficiency of voltage regulators $120_1$, $120_2$, $120_3$, and $120_4$ and IC device 100 can be improved. The frequency fs of clock signal $CLK_{REF}$ can be adjusted (altered) by adjusting the value of information $CODE_{fs}$ provided to FCC 130. Information $CODE_{fs}$ is digital information (e.g., a digital code) that can include a number of bits (e.g., frequency control input bits). The value (the value of the bits) of information $CODE_{fs}$ can be adjusted through an interface (e.g., test access interface) during the manufacturing of IC device 100, and can be adjusted by a power management unit (PMU) 140 of IC device 100, dynamically, during operations of IC device 100 as part of overall voltage regulator configuration management (e.g., power states (PS)). The frequency fs of clock signal $CLK_{REF}$ can be adjusted in real time with a negligible loss or without loss of regulation for a given search range (e.g., frequency range).

Auto-trim module 101 (e.g., which can include a finite-state machine (FSM)) can operate during a calibration operation of IC device 100 to optimize (e.g., automatically optimize) the frequency of clock signal CLK_REF for each of the power states of IC device 100. For example, auto-trim module 101 can search and determine the optimal PWM and continuous conduction mode (CCM) switching frequency (e.g., fs) across the power state of IC device 100.

As mentioned above, an IC device (e.g., IC device 100) may have variations in operating conditions (e.g., analog domain differences) of voltage regulators (e.g., $120_1$, $120_2$, $120_3$, and $120_4$) among power states of the IC device. The calibration operation performed by auto-trim module 101 of FIG. 1 can find an optimal value for the switching frequency (e.g., fs) of the voltage regulators of the IC device (e.g., IC device 100) for each of the power states (per power state basis) of the IC device. As also mentioned above, different IC devices of the same design may also have variations in operating conditions (e.g., analog domain differences) and among power states. The calibration operation performed by auto-trim module 101 of FIG. 1 can also find an optimal value for the switching frequency (e.g., fs) of the voltage regulators of the IC device (e.g., IC device 100) based on a device basis, such that different IC devices of the same design can have different optimal values for the switching frequency (e.g., fs) of the voltage regulators of a respective IC device.

During the calibration operation, auto-trim module 101 can receive (e.g., read) current information (e.g., read the values) of currents $I_{IN1}$, $I_{IN2}$, $I_{IN3}$, and $I_{IN4}$ from current sensors $122_1$, $122_2$, $122_3$, and $122_4$ to adjust the value of information $CODE_{fs}$ based on the values (e.g., the sum) of currents $I_{IN1}$, $I_{IN2}$, $I_{IN3}$, and $I_{IN4}$. The calibration operation (e.g., using auto-trim module 101 and current sensors $122_1$, $122_2$, $122_3$, and $122_4$ of IC device 100) can be performed on a per power state basis. For example, if IC device 100 has "n" power states (where n integer greater than one), IC device 100 can perform "n" calibration operations for the "n" power states of IC device 100. The result from a calibration operation for a particular power state can be recorded to provide a final result (e.g., optimal value) for the value of the frequency of clock signal CLK_REF for that particular power state.

The frequency fs of clock signal CLK_REF generated by VCO 132 can be initially set (e.g., set before the calibration operation using auto-trim module 101) to match the frequency of a clock signal $CLK_{INITIAL\_REF}$, which can be an externally provided reference (e.g., trimming) clock signal. As mentioned above, the frequency fs of clock signal CLK_REF can be controlled by the value of information $CODE_{fs}$. In FIG. 1, FCC 130 can include a selector (e.g., a multiplexor) 134 to select either information $CODE_{fs\_PRG}$ or $CODE_{fs\_TRIM}$ to be information $CODE_{fs}$. Selector 134 can be controlled based on the value of information (e.g., control selection) SEL. Each of information $CODE_{fs\_PRG}$ or $CODE_{fs\_TRIM}$ can be digital information.

During a calibration operation, selector 134 can be controlled (e.g., by providing a value to information SEL) to select information $CODE_{fs\_TRIM}$ to be information $CODE_{fs}$. The value of information $CODE_{fs\_TRIM}$ can be set at an initial value (e.g., a minimum value within a frequency range (e.g., predetermined frequency range based on design)). Then, the value of information $CODE_{fs\_TRIM}$ can be adjusted (e.g., automatically adjusted) based on the calibration operation (described in more detail with reference to FIG. 2) that searches for an optimal value for the frequency fs of clock signal CLK_REF.

After the optimal value for the frequency fs of clock signal $CLK_{REF}$ is determined (e.g., based on the calibration operation), the value of information $CODE_{fs\_TRIM}$ can be recorded and stored (e.g., programmed) in memory circuitry 150 in IC device 100 as the value of information $CODE_{fs\_PRG}$. Memory circuitry 150 can include fuses (or alternatively anti-fuses). The fuses can be configured (e.g., broken (e.g., burnt)) based on the value (e.g., final value) of information $CODE_{fs\_TRIM}$ that results in the optimal value for the frequency fs of clock signal $CLK_{REF}$. Thus, the value of in information $CODE_{fs\_PRG}$ for a particular state is based on (e.g., is the same as) the value of information CO- $DE_{fs\_TRIM}$ that results in the optimal value for the frequency fs of clock signal $CLK_{REF}$ of that particular power state.

IC device 100 can perform (e.g., repeat) the calibration operation for different power state of IC device 100. Thus, IC device 100 can store store in memory circuitry 150) different values (multiple values) for information $CODE_{fs\_PRG}$ that correspond to different power states of IC device 100. The value for information $CODE_{fs\_PRG}$ of one power state of IC device 100 can be different from the value for information $CODE_{fs\_PRG}$ of another power state of IC device 100. Thus, the value of for the frequency fs of clock signal $CLK_{REF}$ of one power state of IC device 100 can be different from the value of for the frequency fs of clock signal $CLK_{REF}$ of another power state of IC device 100.

After the calibration operation for the power states of IC device 100 (after the values of information $CODE_{fs\_TRIM}$ for different power states are stored), selector 134 can be controlled (e.g., by changing the value of SEL from one value to another value) to deselect information $CODE_{fs\_TRIM}$ and select information $CODE_{fs\_PRG}$ to be information $CODE_{fs}$ for use in normal operations of IC device 100. Thus, information $CODE_{fs\_TRIM}$ from auto-trim module 101 may no longer be used by FCC 130 after the calibration operation. Memory circuitry 150 may include a lookup table (not shown) that stores different values of information $CODE_{fs\_PRG}$ for different power states. During a normal operation, IC device 100 can access the lookup table to select the value of information $CODE_{fs\_PRG}$ (among the different values for information $CODE_{fs\_PRG}$) to be used as information $CODE_{fs\_PRG}$ to control the frequency fs of clock signal $CLK_{REF}$, depeneding on which power state that IC device 100 operates during that normal operation.

Thus, as described above with reference to :FIG. 1, auto-trim module 101 of IC device 100 can automatically search and determine the optimal switching frequency (e.g., PWM+CCM switching frequency fs) for each of the power states of IC device 100. The switching frequency is based on the value of information $CODE_{fs\_TRIM}$. For a configuration (e.g., static mode configuration) of IC device 100, the value of information $CODE_{fs\_TRIM}$ can be set (e.g., stored in the form of configuring fuses in IC device 100) for subsequent use (e.g., used by PMU 140). In this configuration (e.g., static mode configuration), each power state can have its own value of information $CODE_{fs\_TRIM}$ to maximize efficiency, reduce power consumption, and improve system performance under power constraints. In this configuration (e.g., static mode configuration), auto-trim module 101 can be disabled, such that is it unused during subsequent operations (e.g., normal operations) of IC device 100.

In an alternative configuration (e.g., dynamic mode configuration) of IC device 100, the techniques described above can be used in real time operations of IC device 100. For example, instead of running auto-trim module 101, setting (e.g., configuring fuses) the value of information $CODE_{fs\_TRIM}$, and disabling running auto-trim module 101, the alternative configuration can train auto-trim module 101 and allow it to be used during real-time operations of IC device. In the alternative configuration (e.g., dynamic mode configuration), the switching frequency (e.g., fs) of voltage regulators $120_1$, $120_2$, $120_3$, and $120_4$ can be based on a per device basis. For example, the switching frequency in the alternative configuration is the same across power states of IC device 100.

Figure 2:
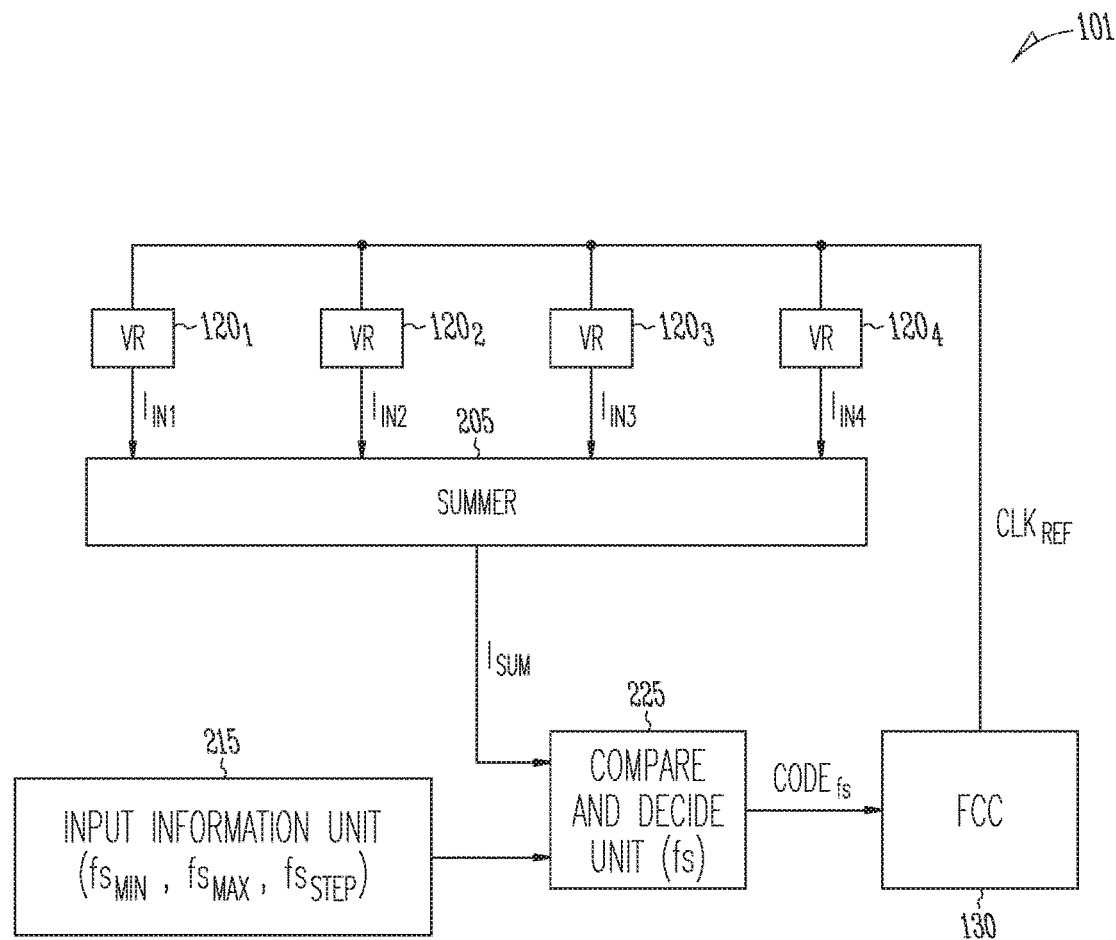
FIG. 2 shows a portion of IC device of FIG. 1 including detail of the auto-trim module of the IC device, according to some embodiments described herein.

FIG. 2 shows a portion of IC device 100 of FIG. 1 including detail of the auto-trim module 101, according to some embodiments described herein. As shown in FIG. 2, auto-trim module 101 can include a summer 205, an input information unit 215, and a compare and decide unit 225. Summer 205 can operate to receive currents $I_{IN1}$, $I_{IN2}$, $I_{IN3}$, and $I_{IN4}$ from respective current sensors $122_1$, $122_2$, $122_3$, and $122_4$ (shown in FIG. 1) of voltage regulators $120_1$, $120_2$, $120_3$, and $120_4$, respectively. Summer 205 can calculate the sum of currents $I_{IN1}$, $I_{IN2}$, $I_{IN3}$, and $I_{IN4}$ and generate information (e.g., a sum of currents) $I_{SUM}$. During a particular power state of IC device 100, the value of information $I_{SUM}$ is based on (e.g., equal to) the value of current $I_{IN}$ (FIG. 1) during that particular power state. Different power states of IC device 100 can have different values of $I_{IN}$. Thus, the value of $I_{SUM}$ can be different from one power state to another power state of IC device 100.

In FIG. 2, input information unit 215 can provide information INFO_fs.min, INFO_fs.max, and INFO_fs.step that are used for a calibration operation of determining (finding) the optimal value for the frequency of clock signal $CLK_{REF}$. Information INFO_fs.min, INFO_fs.max, and INFO_fs.step can include values associated with (e.g., values for) a frequency $fs_{MIN}$ (e.g., a minimum frequency), a frequency $fs_{MAX}$ (e.g., a maximum frequency), and a frequency increment (e.g., a frequency step) $fs_{STEP}$. Frequency $fs_{MIN}$ and $fs_{MAX}$ can be a frequency range (e.g., search range) of frequency that auto-trim module 101 can use during the calibration of searching for the optimal value for frequency fs of clock signal $CLK_{REF}$. Information INFO_fs.min, INFO_fs.max, and INFO_fs.step are programmable information. For example, the values of INFO_fs.min, INFO_fs.max, and INFO_fs.step can be stored (e.g., programmed) in memory circuitry of IC device 100 that can be part of memory circuitry 150 of FIG. 1 or memory circuitry different from memory circuitry 150 of FIG. 1.

in FIG. 2, auto-trim module 101 can operate to select a switching frequency (e.g., the frequency of clock signal CLK_REF) for voltage regulators $120_1$, $120_2$, $120_3$, and $120_4$ of IC device 100. During a calibration operation, auto-trim module 101 can receive (e.g., read) currents $I_{IN1}$, $I_{IN2}$, $I_{IN3}$, and $I_{IN4}$ from respective current sensors $122_1$, $122_2$, $122_3$, and $122_4$ of voltage regulators $120_1$, $120_2$, $120_3$, and $120_4$. Then, auto-trim module 101 can determine (e.g., calculate) the total value (sum) of currents $I_{IN1}$, $I_{IN2}$, $I_{IN3}$, and $I_{IN4}$ of IC device 100 (e.g., full chip input current $I_{IN}$) can be $I_{SUM}=I_{IN1}+I_{IN2}+I_{IN3}+I_{IN4}$. Auto-trim module 101 can control the frequency fs of clock signal $CLK_{REF}$ based on the value of information $CODE_{fs}$ (e.g., based on the values of the bits of information $CODE_{fs}$). During a calibration operation, auto-trim module 101 can set (e.g., at the beginning of the calibration operation) the frequency of clock signal $CLK_{REF}$ to be frequency $fs_{MIN}$ (e.g., the minimum frequency search range) and record the value of current $I_{SUM}$ (e.g., full chip input current). Auto-trim Module 101 can increment the frequency fs of clock signal $CLK_{REF}$ by frequency increment $fs_{STEP}$ and determine the value of current $I_{SUM}$ for the new setting (the setting after frequency fs is incremented by frequency increment $fs_{STEP}$). For example, in incrementing frequency fs, auto-trim module 101 can adjust (e.g., increase) the value of information $CODE_{fs}$ (which is used to control frequency fs of clock signal $CLK_{REF}$) by an amount based on (e.g., equal to) the value of information INFO_fs.step (which is the value for frequency increment $fs_{STEP}$).

If the new value of current $I_{SUM}$ is less than the previous value (the value before the frequency increment is applied to frequency fs) of current $I_{SUM}$, then auto-trim module 101 saves the new value of current $I_{SUM}$ and the new value of information $CODE_{fs\_TRIM}$. If the new value of current $I_{SUM}$ is not less than the previous of current $I_{SUM}$, then auto-trim module 101 increments frequency fs of clock signal $CLK_{REF}$ by an amount based on (e.g., equal to) frequency increment $fs_{STEP}$ and continues the calibration operation until the search range is exhausted, which is until frequency $fs_{MAX}$ is reached (e.g., until frequency fs is equal to frequency $fs_{MAX}$). The value (e.g., final value) of information $CODE_{fs\_TRIM}$ at the end of the search (e.g., after frequency $fs_{MAX}$ is reached) is the optimal (e.g., the best) value for frequency fs of clock signal $CLK_{REF}$ of IC device 100. The value (e.g., final value) of information $CODE_{fs}$ can be stored in IC device 100 and used to set the value for frequency fs of clock signal $CLK_{REF}$ for subsequent operations (e.g., normal operation) of IC device 100. For example, fuses (e.g., frise in memory circuitry 150 in FIG. 1) of IC device 100 can be configured, such that the value of information $CODE_{fs}$ can be based on the configuration of the fuses.

The techniques described above with reference to FIG. 1 and FIG. 2 allow IC device 100 to have improvements and benefits over some conventional IC devices and techniques. For example, some conventional techniques may either set the switching frequency for voltage regulators in a conventional IC device as a fixed frequency (e.g., fixed configuration) or a frequency only as a function of output load current. Such conventional techniques also are often targeted towards light load optimization (e.g., phase-frequency modulation (PFM) mode) for a given load current where the switching frequency is the same from one IC device to another IC device.

In the techniques described above with reference to FIG. 1 and FIG. 2, the switching frequency (e.g., fs) for voltage regulators $120_1$, $120_2$, $120_3$, and $120_4$ can be optimized (e.g., to achieve least power loss in IC device 100) by monitoring (e.g., sensing) input current (e.g., currents $I_{IN1}$, $I_{IN2}$, $I_{IN3}$, and $I_{IN4}$) of IC device 100 on a per IC device (e.g., per SoC) basis. Since an IC device (e.g., IC device 100) may have different voltage regulator domains for voltage regulators $120_1$, $120_2$, $120_3$, and $120_4$, and since the optimization techniques described herein can be performed at device level (e.g., SoC level), the optimal switching frequency (e.g., sweet spot) of voltage regulators $120_1$, $120_2$, $120_3$, and $120_4$ of the IC device 100 can be measured and controlled (e.g., using information $CODE_{fs\_TRIM}$).

Further, the optimization techniques described herein can be performed across a full dynamic current range (e.g., unrestricted to light load PFM mode type, and in contrast with some conventional techniques). Thus, for a given current, the switching frequency (fs) can be adjusted per IC device basis and per power state basis. This allows IC device 100 to have an improved power management (e.g., lower power loss of IC device 100) in comparison with some conventional IC devices.

Figure 3:
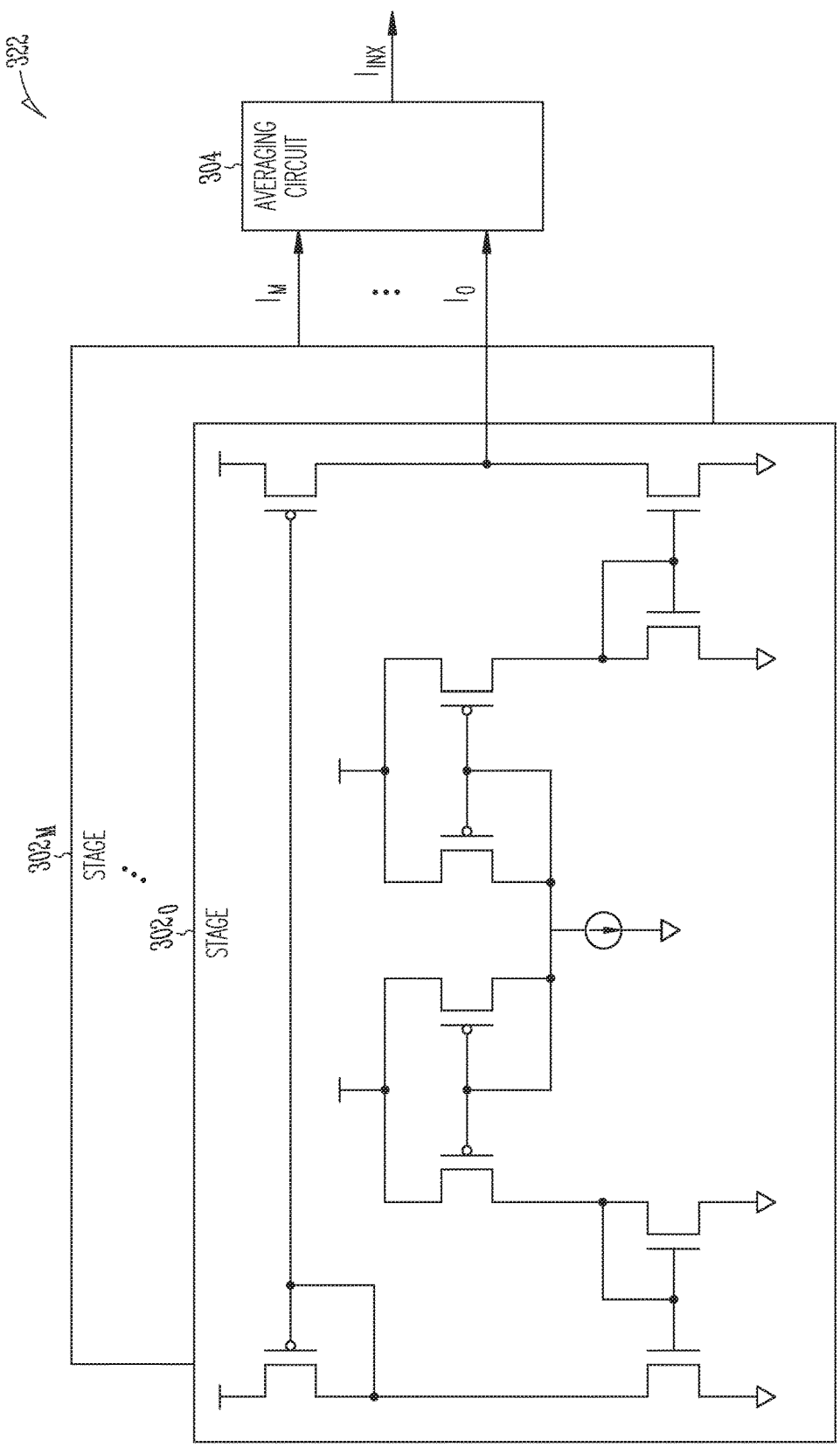
FIG. 3 shows an example current sensor, which can be used for each of current sensors of the IC device of FIG. 1, according to some embodiments described herein.

FIG. 3 shows an example current sensor 322, which can be used for each of current sensors $122_1$, $122_2$, $122_3$, and $122_4$ of IC device 100 of FIG. 1, according to some embodiments described herein. Current sensor 322 can include transistors coupled in ways as shown in FIG. 3. Current sensor 322 can include multiple current stages $302_0$ through $302_M$ that can have respective outputs to provide currents $I_0$ through $I_M$, respectively. Current sensor 322 can include an averaging circuit 304 that can provide a current $I_{INX}$, which is the average of currents $I_0$ through $I_M$. Current $I_{INX}$ can be one of current $I_{IN1}$, $I_{IN2}$, $I_{IN3}$, and $I_{IN4}$ of FIG. 2. FIG. 3 shows an example of a current sensor. However, any other current sensors can be used.

Figure 4:
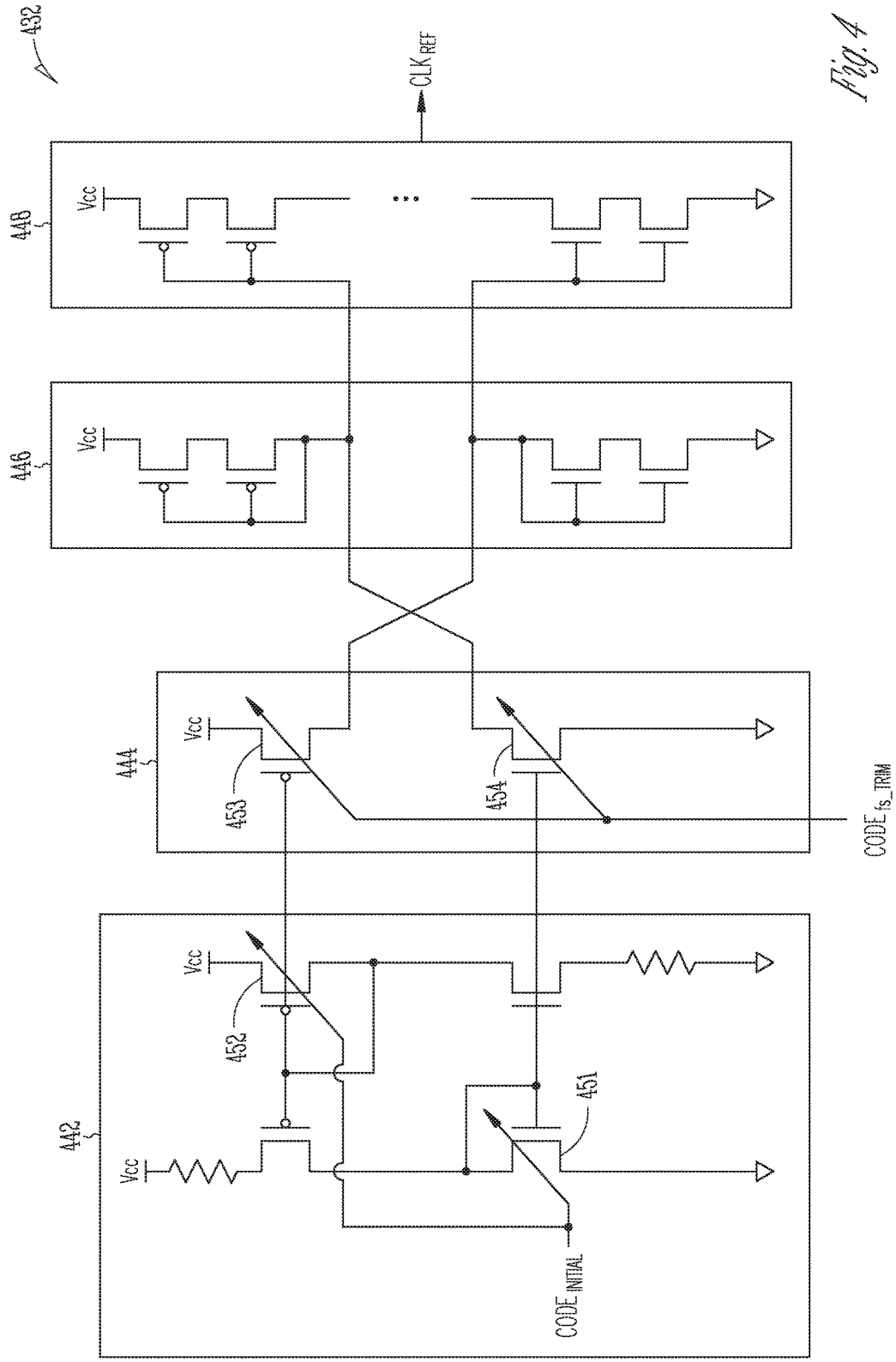
FIG. 4 shows an example voltage-controlled oscillator (VCO), which can be used for a VCO of the IC device of FIG. 1, according to some embodiments described herein.

FIG. 4 shows an example VCO 432, which can be used for VCO 132 of IC device 100 of FIG. 1, according to some embodiments described herein. As shown in FIG. 4, VCO 432 can include a bias core circuit 442, bias copy circuit 444, a delay cell (e.g., delay cell replica) circuit 446, and a VCO output circuit 448 to provide clock signal $CLK_{REF}$. VCO 432 can be controlled by information $CODE_{INITIAL}$ and $CODE_{fs\_TRIM}$ such that the frequency of clock signal $CLK_{REF}$ can be controlled (e.g., adjusted) by adjusting the currents on current paths that include transistors 451, 452, 453, and 454 using respective information $CODE_{INITIAL}$ and $CODE_{fs\_TRIM}$.

Information $CODE_{INITIAL}$ can include a number of hits. The value information $CODE_{INITIAL}$ can be selected (e.g., predetermined) based on the value of the frequency (e.g., initial frequency) of clock signal $CLK_{INITIAL\_REF}$ (e.g., an externally provided trimming reference clock signal shown in FIG. 1).

The value of information $CODE_{fs\_TRIM}$ can be provided by auto-trim module 101 (FIG. 1 and FIG. 2). During a calibration operation to determine the optimal value for frequency fs of clock signal $CLK_{REF}$, the value information $CODE_{fs\_TRIM}$ (the values of the bits that control transistors 453 and 454) can be adjusted. After the optimal value for frequency fs of clock signal $CLK_{REF}$ is determined (e.g., after the value of $CODE_{fs}$ in FIG. 2 is determined), the value information $CODE_{fs\_TRIM}$ can be recorded (e.g., stored) and used for subsequent operations (e.g., normal operations). For example, the value of information $CODE_{fs\_TRIM}$ can be used to configure fuses in memory circuitry 150 and use it for normal operations of IC device 100, as described above with reference to FIG. 1 and FIG. 2. FIG. 4 shows an example of a VCO. However, any other VCOs can be used.

Figure 5:
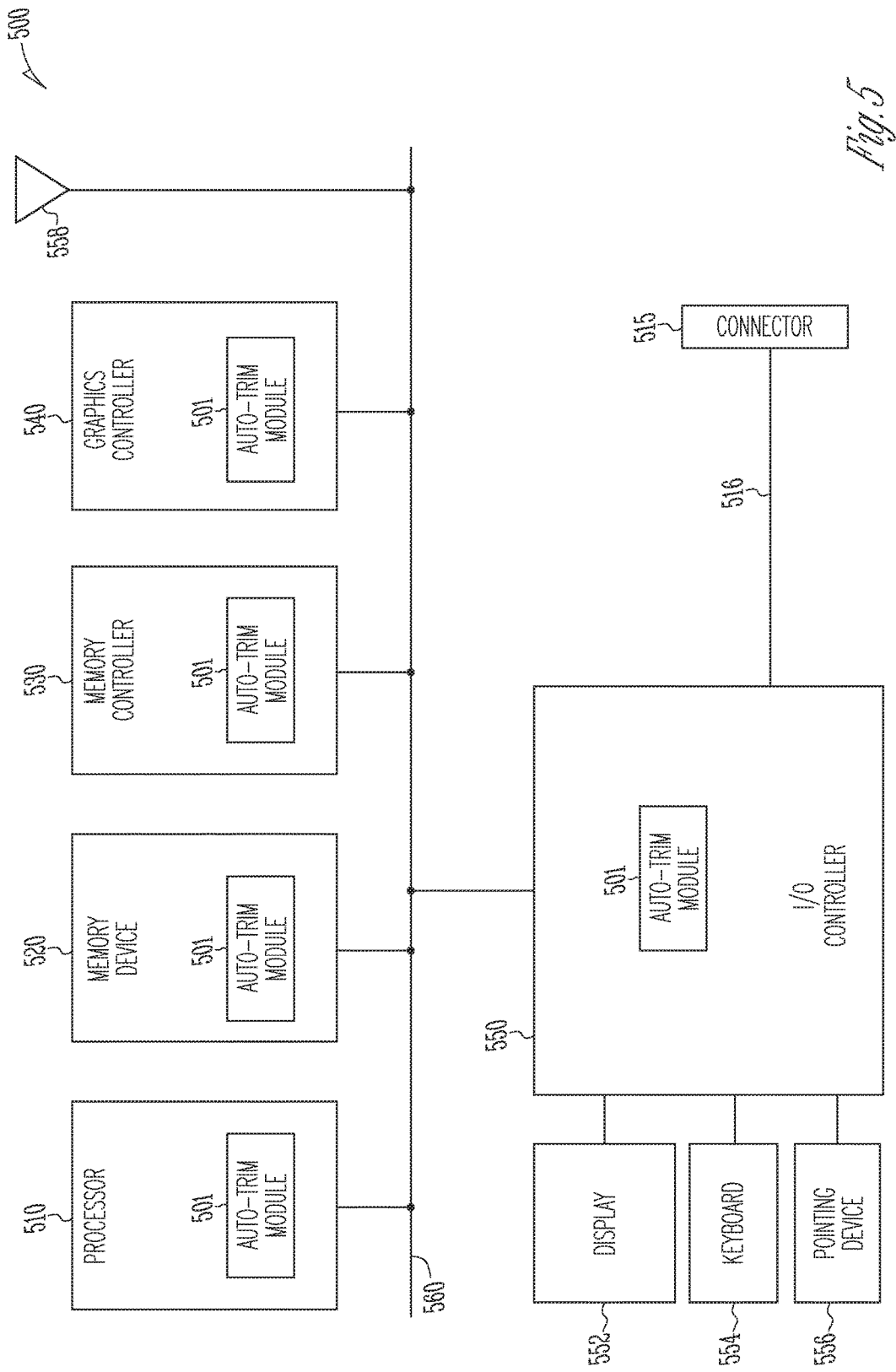
FIG. 5 shows an apparatus in the form of a system (e.g., electronic system), according to some embodiments described herein.

FIG. 5 shows an apparatus in the form of a system (e.g., electronic system) 500, according to some embodiments described herein. System 500 can include or be included in a computer, a tablet, or other electronic systems. As shown in FIG. 5, system 500 can include a processor 510, a memory device 520, a memory controller 530, a graphics controller 540, an input/output (I/O) controller 550, a display 552, a keyboard 554, a pointing device 556, at least one antenna 558, a connector 515, and a bus 560 (e.g., conductive lines formed on a circuit board (not shown) of system 500).

Each of processor 510, memory device 520, memory controller 530, graphics controller 540, and I/O controller 550 can include an IC chip.

In some arrangements, system 500 does not have to include a display. Thus, display 552 can be omitted from system 500. In some arrangements, system 500 does not have to include any antenna. Thus, antenna 558 can be omitted from system 500.

Processor 510 can include a general-purpose processor or an application specific integrated circuit (ASIC). Processor 510 can include a central processing unit (CPU).

Memory device 520 can include a dynamic random access memory (DRAM) device, a static random access memory (SRAM) device, a flash memory device, phase change memory, a combination of these memory devices, or other types of memory. FIG. 5 shows an example where memory device 520 is a stand-alone memory device separated from processor 510. In an alternative arrangement, memory device 520 and processor 510 can be located on the same die. In such an alternative arrangement, memory device 520 is an embedded memory in processor 510, such as embedded DRAM (eDRAM), embedded SRAM (eSRAM), embedded flash memory, or another type of embedded memory.

Display 552 can include a liquid crystal display (LCD), a touchscreen (e.g., capacitive or resistive touchscreen), or another type of display. Pointing device 556 can include a mouse, a stylus, or another type of pointing device.

I/O controller 550 can include a communication module for wired or wireless communication (e.g., communication through one or more antennas 558). Such wireless communication may include communication in accordance with WiFi communication technique, Long Term Evolution Advanced (LTE-A) communication technique, or other communication techniques.

I/O controller 550 can also include a module to allow system 500 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 515 can be arranged (e.g., can include terminals, such as pins) to allow system 500 to be coupled to an external device (or system). This may allow system 500 to communicate (e.g., exchange information) with such a device (or system) through connector 515. Connector 515 may be coupled to I/O controller 550 through a connection 516 (e.g., a bus).

Connector 515, connection 516, and at least a portion of bus 560 can include elements (e.g., conductive terminals, conductive lines, or other conductive elements) that conform with at least one of USB, DP, FIDMI, Thunderbolt, PCIe, Ethernet, and other specifications.

FIG. 5 shows the elements (e.g., devices and controllers) of system 500 arranged separately from each other as an example. For example, each of processor 510, memory device 520, memory controller 530, graphics controller 540, and I/O controller 550 can be located on a separate IC chip (e.g., separate semiconductor dies). In some arrangements, two or more elements (e.g., processor 510, memory device 520, graphics controller 540, and I/O controller 550) of system 500 can be located on the same die (e.g., same IC chip) that can form a system-on-chip (SoC).

As shown in FIG. 5, each of processor 510, memory device 520, memory controller 530, graphics controller 540, and I/0 controller 550 can include an auto-trim module 501. Auto-trim module 501 can include auto-trim module 101 described above with reference to FIG. 1 and FIG. 2. In FIG. 5, auto-trim module 501 can operate to provide an optimal value for a switching frequency of voltage regulators (e.g., FIVRs, not shown in FIG. 5) included in a respective device of system 500.

Figure 6:
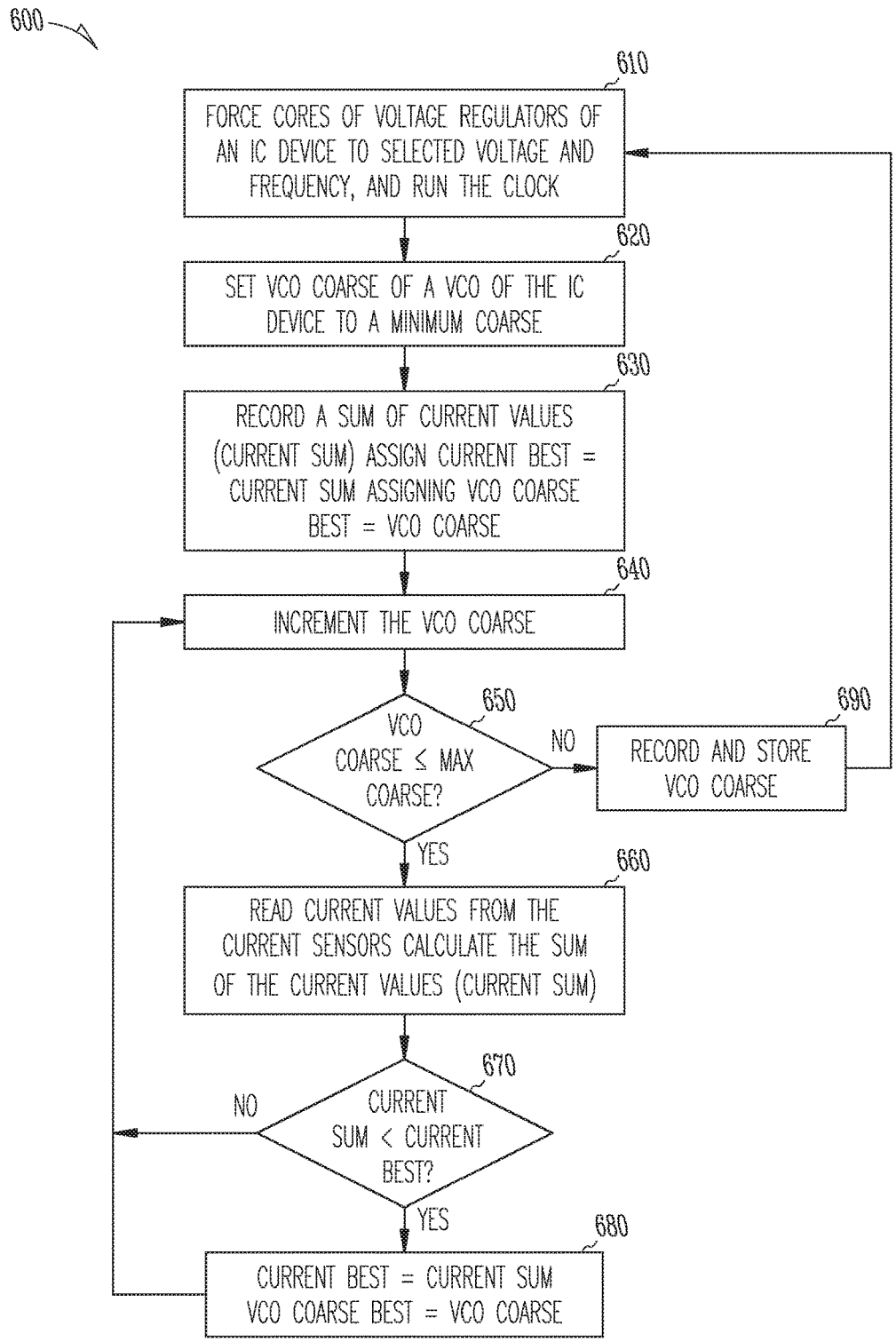
FIG. 6 is a flowchart showing a method of operating an apparatus, according to some embodiments described herein.

FIG. 6 is a flowchart showing a method 600 of operating an apparatus, according to some embodiments described herein. The apparatus used in method 600 can include any of the apparatuses (e.g., apparatus 100 and system 500 including auto-trim modules 101 and 501) described above with reference to FIG. 1 through FIG. 5. Some of the activities in method 600 may be performed by hardware, software, firmware, or any combination of hardware, software, and firmware. For example, some of the activities in method 600 may be performed by hardware, software, firmware, or any combination of hardware, software, and firmware implemented in any of the apparatus (e.g., apparatus 100 and system 500 including auto-trim modules 101 and 501) described above with reference to FIG. 1 through FIG. 5.

Method 600 can include a VCO setting algorithm that can be implemented in an IC device (e.g., implemented in the silicon of IC device 100) that can include auto-trim module 101, voltage regulators $120_1$, $120_2$, $120_3$, and $120_4$, current sensors $122_1$, $122_2$, $122_3$, and $122_4$, and PMU 140 of FIG. 1. Multiple optimized frequency settings corresponding to key operating points obtained through method 600 of FIG. 6, can be stored (e.g., in form of configuring fuses) in the IC device. During operation, the PMU of the IC device can apply the most optimal setting based on the particular configuration it picks for a particular voltage regulator (e.g., a particular FIVR of the IC device), The example of the method 600 shown in FIG. 6 describes how an optimal (e.g., the best) switching frequency (e.g., fs) setting can be determined and stored (e.g., fused) in the IC device on a per IC device (e.g., per part) basis. However, method 600 can be extended to make the VCO setting algorithm programmable in boot time and can be executed in real time for a particular IC device.

As shown in FIG. 6, activity 610 of method 600 can include forcing all cores of the voltage regulators of the IC device used in method 600 to a selected voltage and frequency, and then running the clock. Activity 620 can include setting VCO coarse of a VCO (e.g., VCO 132 or VCO 432) of the IC device to a minimum coarse within a coarse range that the VCO is designed to operate. The coarse range of the VCO can be a range from a minimum coarse to a maximum coarse. The minimum coarse and the minimum coarse are known values (e.g., predetermined setting values) based on the design of the VCO. The coarse range the VCO can correspond to the frequency range (e.g., $fs_{MIN}$ to $fs_{MAX}$) of the clock signal (e.g., $CLK_{REF}$) generated by the VCO). In activity 620, setting the VCO coarse of the VCO to a minimum coarse can cause the clock signal to have a minimum frequency (e.g., $fs_{MIN}$) within the frequency range. The value of the VCO coarse can correspond to the value of information $CODE_{fs\_TRIM}$ shown in FIG. 1 and FIG. 2.

Activity 630 of method 600 of FIG. 6 can include recording (e.g., calculating) a sum of current values from current sensors (e.g., $122_1$, $122_2$, $122_3$, and $122_4$) of respective voltage regulators included in the IC device, assigning current best to be the sum of the current values (current best=current sum), and assigning VCO coarse best to be the VCO coarse (VCO coarse best=VCO coarse). VCO coarse best can correspond to the optimal frequency of the clock signal.

Activity 640 can include incrementing the VCO coarse by a coarse amount to cause a change (e,g. an increase) in the frequency of the clock signal. The coarse amount can correspond to a frequency increment (e.g., $fs_{STEP}$).

Activity 650 can include determining whether the VCO coarse is less than or equal to a maximum coarse (whether VCO coarse <=Max coarse). As mentioned above, the maximum coarse can correspond to a maximum frequency (e.g., $fs_{MAX}$) within the frequency range.

In activity 650, if VCO coarse is less than or equal to (<=) Max coarse is true (indicated by "YES" in FIG. 6), method 600 can continue with activity 660 that can include reading current values from the current sensors of the voltage regulators and calculating the sum of the current values.

Activity 670 can include determining whether the sum (e.g., $I_{SUM}$) of the current values is less than the current best (e.g., whether $I_{SUM}$<current best).

In activity 670, if $I_{SUM}$<current best is true (indicated by "YES" in FIG. 6), method 600 can continue with activity 680 that can include setting current best to be the stun of the current values. setting VCO coarse best to be VCO coarse, and going back to activity 640 to repeat some of the previous activities of method 600.

In activity 670, if $I_{SUM}$<current best in activity 670 is false (indicated by "NO" in FIG. 6), method 600 can go back to activity 640 and repeat some of the previous activities of method 600.

In activity 650, if VCO coarse <=Max coarse is false (indicated by "NO" in FIG. 6), method 600 can continue with activity 690 that can record and store the value of VCO coarse. The value of VCO coarse in activity 690 is associated with the optimal (e.g., the best) switching frequency (e.g., fs) for the voltage regulators of the IC device. Activity 690 can store the value of VCO coarse in the form of configuring fuses (e.g. burning fuses) in memory circuitry (e.g., memory circuitry 150) of the IC device. The stored value (e.g., VCO coarse setting) can be used subsequent (e.g., normal) operations of the IC device. Method 600 can repeat the activities described above for each power state of the IC design. Thus, multiple values of VCO coarse settings (which are VCO coarse best values) can be stored in the IC device for multiple power states.

Method 600 can include fewer or more activities relative to activities 610 through 690 shown in FIG. 6. For example, method 600 can include activities and operations of apparatus 100 and system 500 including operation of auto-trim modules 101 and 501 described above with reference to FIG. 1 through FIG. 5.

The illustrations of the apparatuses and methods described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including voltage regulators included in an integrated circuit device, each of the voltage regulators including a current sensor, a frequency control block to provide a clock signal to each of the voltage regulators, the clock signal having a frequency based on digital information, and a module to receive current information from the current sensor of each of the current sensors and provide the digital information to the frequency control block, the digital information having a value based on the current information from each of the current sensors.

In Example 2, the subject matter of Example 1 may optionally include, wherein the module is to generate the digital information based on a sum of the current information from each of the current sensors.

In Example 3, the subject matter of Example 2 may optionally include, wherein the frequency control block includes an oscillator to provide the clock signal, and the oscillator is to receive the digital information to control the frequency of the clock signal.

In Example 4, the subject matter of Example 3 may optionally include, wherein the module is to adjust the value of the digital information based on a comparison between a value of the sum and a selected value.

In Example 5, the subject matter of Example 1 may optionally include, wherein the module is to generate a first sum based on the current information from each of the current sensors during a first time interval, generate a second sum based on the current information from each of the current sensors during a second time interval after the first time interval, and to adjust the value of the digital frequency if the second sum has a value less than a value of the first sum.

In Example 6, the subject matter of Example 1 or 2 may optionally include, wherein the module is to generate the digital information during a first power state of the apparatus, and generate and additional digital information during a second power state of the apparatus, and the additional digital information has a value different from the value of the digital information during the first power state of the apparatus.

In Example 7, the subject matter of Example 6 may optionally include, further comprising memory circuitry to store the value of the digital information, and to store the value of the additional digital information.

In Example 8, the subject matter of any of Examples 1-5 may optionally include, wherein the frequency control block includes a selector to provide the digital information, the selector to receive a first information having a value based on the current information from each of the current sensor, to receive a second information from memory circuitry, and to select between the first information and the second information to be the digital information.

Example 9 includes subject matter (such as a device, an electronic apparatus (e.g., circuit, electronic system, or both), or a machine) including a summer to generate a sum of currents from respective current sensors of voltage regulators of an integrated circuit device, a unit to perform a comparison between a value of the sum and a selected value and generate digital information based on the comparison, and a frequency control block to receive the digital information to control a clock signal provided to each of the voltage regulators, wherein a frequency of the clock signal is based on a value of the digital information.

in Example 10, the subject matter of Example 9 may optionally include, wherein he unit is to perform the comparison within a range of frequencies of the clock signal.

In Example 11, the subject matter of Example 9 or 10 may optionally include, wherein the unit is to perform the comparison within a range of frequencies of the clock signal.

In Example 12, the subject matter of Example 9 or 10 may optionally include, wherein the frequency control block includes a voltage-controlled oscillator to generate the clock signal, the voltage-controlled oscillator to receive control information having a value based on the value of the digital information.

In Example 13, the subject matter of Example 9 may optionally include, wherein the frequency control block includes a selector to select one of first information from memory circuitry and second information from a module to be the digital information, and a value of the first information is based on a value of the second information.

In Example 14, the subject matter of Example 9 may optionally include, wherein a value of the digital information is associated with a frequency within a range of frequencies of the clock signal.

In Example 15, the subject matter of Example 9 may optionally include, wherein the unit is to generate the digital information during a first time interval, and the integrated circuit device includes memory circuitry to store the value of the digital information, and the frequency control block is to control the frequency of the clock signal during a second time based on the value of the digital information stored in the memory circuitry.

In Example 16, the subject matter of Example 9 may optionally include, wherein a value of the digital information is associated with a power state among different power states of the integrated circuit device.

In Example 17, the subject matter of Example 9 may optionally include, wherein the unit is to perform a comparison between a value of the sum and a selected value and generate digital information based on a comparison during a first power state of the of the integrated circuit device, the unit is to perform an additional comparison between a value of an additional sum and an additional selected value and generate additional digital information based on a comparison during a second power state of the of the integrated circuit device, and the value of the digital information is different from a value of the additional digital information.

Example 18 includes subject matter (such as a device, an electronic apparatus (e.g., circuit, electronic system, or both), or a machine) including conductive lines on a circuit board, an antenna coupled to the conductive lines, and a device coupled to the conductive lines, the device including voltage regulators included in an integrated circuit device, each of the voltage regulators including a current sensor, a frequency control block to provide a clock signal to each of the voltage regulators, the clock signal having a frequency based on digital information, and a module to receive current information from the current sensor of each of the current sensors and provide the digital information to the frequency control block, the digital information having a value based on the current information from each of the current sensors.

In Example 19, the subject matter of Example 18 may optionally include, wherein the device includes a processor.

In Example 20, the subject matter of Example 18 or 19 may optionally include, further comprising a connector coupled to at least one of the conductive lines and the device, the connector conforming with at least one of Universal Serial Bus (USB), DisplayPort (DP), High-Definition Multimedia Interface (HDIVED), Thunderbolt, Ethernet, and Peripheral Component Interconnect Express (PCIe) specifications.

Example 21 includes subject matter (such as a method of operating a device, an electronic apparatus (e.g., circuit, electronic system, or both), or a machine) including receiving currents from current sensors of respective voltage regulators included in an integrated circuit device, calculating sums of the currents within a frequency range of a clock signal provided to the voltage regulators, wherein each of the sums is calculated when the clock signal has a different frequency within the frequency range, providing digital information to control a frequency of the clock signal, and adjusting a value of the digital information, such that the value of digital information is associated with a select sum among the sums, the selected sum having a least value among values of the sums.

In Example 22, the subject matter of Example 21 may optionally include, wherein configuring memory circuitry based on the value of the digital information that is associated with the selected sum In Example 23 the subject matter of Example 21 may optionally include, wherein receiving the currents and calculating the value of the digital information are performed for each power state among power states of integrated circuit device.

In Example 24, the subject matter of Example 23 may optionally include, wherein configuring memory circuitry based on the value of digital information associated with the selected sum for each of the power states of the integrated circuit device.

Example 25 includes subject matter (such as a device, an electronic apparatus (e.g., circuit, electronic system, or both), or machine) including means for performing any of the subject matter of Examples 21-24.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the frill range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   voltage regulators included in an integrated circuit device, each of the voltage regulators including a current sensor;
   a frequency control block to provide a clock signal to each of the voltage regulators, the clock signal having a frequency based on digital information; and
   a module to receive current information from the current sensor of each of the current sensors and provide the digital information to the frequency control block, the digital information having a value based on the current information from each of the current sensors.

2. The apparatus of claim 1, wherein the module is to generate the digital information based on a sum of the current information from each of the current sensors.

3. The apparatus of claim 2, wherein the frequency control block includes an oscillator to provide the clock signal, and the oscillator is to receive the digital information to control the frequency of the clock signal.

4. The apparatus of claim 3, wherein the module is to adjust the value of the digital information based on a comparison between a value of the sum and a selected value.

5. The apparatus of claim 1, wherein the module is to:
   generate a first sum based on the current information from each of the current sensors during a first time interval;
   generate a second sum based on the current information from each of the current sensors during a second time interval after the first time interval; and
   to adjust the value of the digital frequency if the second sum has a value less than a value of the first sum.

6. The apparatus of claim 1, wherein the module is to:
generate the digital information during a first power state of the apparatus; and
generate and additional digital information during a second power state of the apparatus, and the additional digital information has a value different from the value of the digital information during the first power state of the apparatus.

7. The apparatus of claim 6, further comprising memory circuitry to store the value of the digital information, and to store the value of the additional digital information.

8. The apparatus of claim 1, wherein the frequency control block includes a selector to provide the digital information, the selector to receive a first information having a value based on the current information from each of the current sensor, to receive a second information from memory circuitry, and to select between the first information and the second information to be the digital information.

9. An apparatus comprising:
a summer to generate a sum of currents from respective current sensors of voltage regulators of an integrated circuit device;
a unit to perform a comparison between a value of the sum and a selected value and generate digital information based on the comparison; and
a frequency control block to receive the digital information to control a clock signal provided to each of the voltage regulators, wherein a frequency of the clock signal is based on a value of the digital information.

10. The apparatus of claim 9, wherein the unit is to perform the comparison within a range of frequencies of the clock signal.

11. The apparatus of claim 9, wherein the frequency control block includes a voltage-controlled oscillator to generate the clock signal, the voltage-controlled oscillator to receive control information having a value based on the value of the digital information.

12. The apparatus of claim 9, wherein a value of the digital information is associated with a selected sum of currents from respective current sensors, and the selected sum of currents has a least value among values of sums of the currents, wherein the values of the sums of the currents are calculated when the clock signal has different frequencies within a range of frequencies of the clock signal.

13. The apparatus of claim 9, wherein the frequency control block includes a selector to select one of first information from memory circuitry and second information from a module to be the digital information, and a value of the first information is based on a value of the second information.

14. The apparatus of claim 9, wherein a value of the digital information is associated with a frequency within a range of frequencies of the clock signal.

15. The apparatus of claim 9, wherein the unit is to generate the digital information during a first time interval, and the integrated circuit device includes memory circuitry to store the value of the digital information, and the frequency control block is to control the frequency of the clock signal during a second time based on the value of the digital information stored in the memory circuitry.

16. The apparatus of claim 9, wherein a value of the digital information is associated with a power state among different power states of the integrated circuit device.

17. The apparatus of claim 9, wherein:
the unit is to perform a comparison between a value of the sum and a selected value and generate digital information based on a comparison during a first power state of the integrated circuit device;
the unit is to perform an additional comparison between a value of an additional sum and an additional selected value and generate additional digital information based on a comparison during a second power state of the of the integrated circuit device; and
the value of the digital information is different from a value of the additional digital information.

18. An apparatus comprising:
conductive lines on a circuit board;
an antenna coupled to the conductive lines; and
a device coupled to the conductive lines, the device including:
voltage regulators included in an integrated circuit device, each of the voltage regulators including a current sensor;
a frequency control block to provide a clock signal to each of the voltage regulators, the clock signal having a frequency based on digital information; and
a module to receive current information from the current sensor of each of the current sensors and provide the digital information to the frequency control block, the digital information having a value based on the current information from each of the current sensors.

19. The apparatus of claim 18, wherein the device includes a processor.

20. The apparatus of claim 18, further comprising a connector coupled to at least one of the conductive lines and the device, the connector conforming with at least one of Universal Serial Bus (USB), DisplayPort (DP), High-Definition Multimedia Interface (HDMI), Thunderbolt, Ethernet, and Peripheral Component Interconnect Express (PCIe) specifications.

* * * * *